United States Patent
Inokuchi et al.

(10) Patent No.: US 8,139,403 B2
(45) Date of Patent: Mar. 20, 2012

(54) SPIN MEMORY AND SPIN TRANSISTOR

(75) Inventors: Tomoaki Inokuchi, Yokohama (JP);
Takao Marukame, Tokyo (JP); Mizue Ishikawa, Yokohama (JP); Hideyuki Sugiyama, Kawasaki (JP); Hisanori Aikawa, Yokohama (JP); Masahiko Nakayama, Yokohama (JP); Tatsuya Kishi, Yokohama (JP); Hiroaki Yoda, Sagamihara (JP); Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/885,833

(22) Filed: Sep. 20, 2010

(65) Prior Publication Data
US 2011/0228596 A1    Sep. 22, 2011

(30) Foreign Application Priority Data
Mar. 19, 2010   (JP) .................. 2010-065084

(51) Int. Cl.
*G11C 11/15* (2006.01)
*G11C 29/82* (2006.01)
(52) U.S. Cl. ................. 365/158; 257/295; 257/E29.323
(58) Field of Classification Search ........................ None
See application file for complete search history.

(56) References Cited

U.S. PATENT DOCUMENTS

| | | | |
|---|---|---|---|
| 6,256,223 | B1 | 7/2001 | Sun |
| 7,602,636 | B2 | 10/2009 | Saito et al. |
| 2004/0130936 | A1 | 7/2004 | Nguyen et al. |
| 2009/0180312 | A1* | 7/2009 | Miura et al. .................. 365/158 |
| 2009/0213642 | A1 | 8/2009 | Raberg et al. |
| 2010/0244163 | A1 | 9/2010 | Daibou et al. |

FOREIGN PATENT DOCUMENTS
JP    2008-66596    3/2008

* cited by examiner

*Primary Examiner* — Hoai V Ho
*Assistant Examiner* — James G Norman
(74) *Attorney, Agent, or Firm* — Oblon, Spivak, McClelland, Maier & Neustadt, L.L.P.

(57) ABSTRACT

Certain embodiments provide a spin memory including a memory cell including a ferromagnetic stacked film that has a stacked structure in which a first ferromagnetic layer, a first nonmagnetic layer, a second ferromagnetic layer, a second nonmagnetic layer, and a third ferromagnetic layer are stacked in this order or reverse order, the third ferromagnetic layer and the second ferromagnetic layer being antiferromagnetically exchange-coupled via the second nonmagnetic layer. The ferromagnetic stacked film includes a current path in which a first and second write currents flow from the first ferromagnetic layer to the third ferromagnetic layer to write a first and second magnetization states into the first ferromagnetic layer respectively, and the second write current is higher than the first write current.

13 Claims, 9 Drawing Sheets

SPIN MEMORY AND SPIN TRANSISTOR

CROSS-REFERENCE TO RELATED APPLICATION

This application is based upon and claims the benefit of priority from prior Japanese Patent Application No. 2010-65084 filed on Mar. 19, 2010 in Japan, the entire contents of which are incorporated herein by reference.

FIELD

Embodiments described herein relate to a spin memory and a spin transistor.

BACKGROUND OF THE INVENTION

In recent years, magnetoresistive devices that utilize tunnel magnetoresistive effects are actively and experimentally used in magnetic random access memories.

Where a magnetoresistive device is used as a memory device in a magnetic random access memory, the magnetoresistive device normally has a ferromagnetic single tunnel junction or a ferromagnetic double tunnel junction. In a ferromagnetic single tunnel junction, one of the two ferromagnetic layers sandwiching a tunnel barrier layer is a fixed magnetization layer (a magnetization reference layer) that has a fixed magnetization direction, and the other one of the two ferromagnetic layers is a magnetic recording layer that has a variable magnetization direction. A ferromagnetic double tunnel junction has a stacked structure formed with a first magnetization reference layer, a first tunnel barrier layer, a magnetic recording layer, a second tunnel barrier layer, and a second magnetization reference layer. Hereinafter, a ferromagnetic single tunnel junction or a ferromagnetic double tunnel junction will also be referred to simply as a MTJ. A memory device having such a MTJ is capable of storing data in a nonvolatile manner, and characteristically requires a short writing time or a short reading time of 10 ns or less. Also, such a memory device is characteristically capable of performing rewriting $10^{15}$ times or more.

As a method of performing writing on such a magnetoresistive device, a spin-injection magnetization reversing technique has been suggested (see U.S. Pat. No. 6,256,223, for example). By the spin-injection magnetization reversing technique, the magnetization of a magnetic recording layer is reversed by injecting spin-polarized electrons (spin injection current) into a magnetic recording layer of a memory device. The value of the spin injection current required for writing becomes smaller as the magnetic recording layer becomes smaller. Accordingly, there is a high expectation for the spin-injection magnetization reversing technique as a method of performing writing on a magnetic random access memory.

However, to perform magnetic writing by the spin-injection magnetization reversing technique, it is necessary to cause a bidirectional current to flow in a magnetoresistive device. Therefore, diode-type architecture (so-called cross-point architecture) that connects magnetoresistive devices and diodes in series between bit lines and word lines cannot be used. In view of this, architecture in which each one memory cell is formed with at least one transistor and one magnetoresistive device needs to be employed, and, as a result, the cell size cannot be made equal to or smaller than the cell size of a dynamic random access memory (DRAM).

As a memory device of a spin-injection magnetization reversal type, there is a known spin transistor (hereinafter also referred to as a spin MOS transistor) having a MTJ in at least either a source electrode or a drain electrode (see Japanese Laid-Open Patent Publication No. 2008-66596, for example). Since a bidirectional current is required at the time of writing in this spin transistor, a switching transistor for switching the direction of the current needs to be connected to each of the source and drain electrodes of the spin transistor. Therefore, the problem of an increased total circuit area is caused as in a magnetoresistive device that performs magnetic writing with spin-injection magnetization reversals.

As described above, a bidirectional current is required for writing in a spin memory or a spin transistor of a conventional spin-injection magnetization reversal type, and the total circuit area cannot be made smaller.

DETAILED DESCRIPTION

Certain embodiments provide a spin memory including a memory cell including a ferromagnetic stacked film that has a stacked structure in which a first ferromagnetic layer, a first nonmagnetic layer, a second ferromagnetic layer, a second nonmagnetic layer, and a third ferromagnetic layer are stacked in this order or reverse order, the third ferromagnetic layer and the second ferromagnetic layer being antiferromagnetically exchange-coupled via the second nonmagnetic layer. The ferromagnetic stacked film includes a current path in which a first and second write currents flow from the first ferromagnetic layer to the third ferromagnetic layer to write a first and second magnetization states into the first ferromagnetic layer respectively, and the second write current is higher than the first write current.

Hereafter, a spin memory and a spin transistor according to embodiments invention will be described more specifically with reference to the drawings.

First Embodiment

Figure 1:
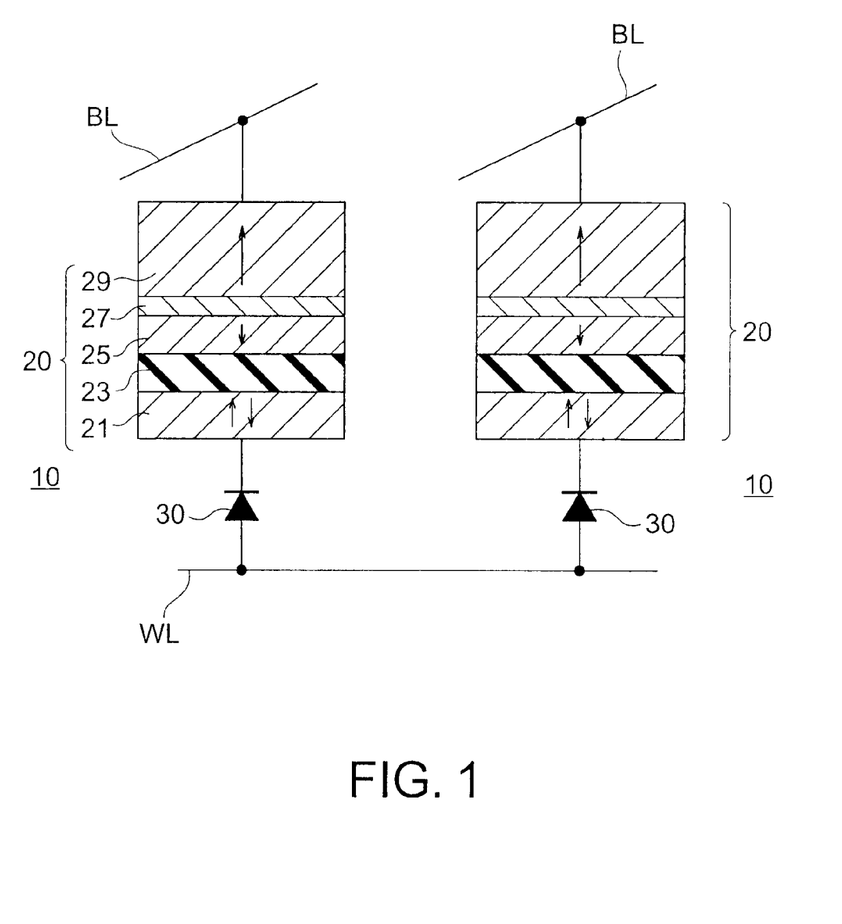
FIG. 1 is a schematic view of a spin memory according to a first embodiment of the present invention.

FIG. 1 shows a spin memory according to a first embodiment of the present invention. The spin memory of the first embodiment has memory cells 10 (two memory cells 10 in FIG. 1) arranged in a matrix fashion. Each of the memory cells 10 includes a ferromagnetic stacked film 20 and a diode 30. The ferromagnetic stacked film 20 has a stacked structure in which a ferromagnetic layer 21, a nonmagnetic layer 23, a ferromagnetic layer 25, a nonmagnetic layer 27, and a ferromagnetic layer 29 are stacked in this order. The ferromagnetic layer 21, the ferromagnetic layer 25, and the ferromagnetic layer 29 each have an easy axis of magnetization that is substantially perpendicular to the film plane. Specifically, when there is not an external magnetic field, the magnetization direction of each of the ferromagnetic layers is substantially perpendicular to the film plane. Here, the film plane means the upper face of each ferromagnetic layer. The magnetization reversal magnetic fields of the ferromagnetic layers 21 and 25 are smaller than that of the ferromagnetic layer 29. The ferromagnetic layer 29 and the ferromagnetic layer 25 are antiferromagnetically magnetic-exchange-coupled via the nonmagnetic layer 27, and the magnetization direction of the ferromagnetic layer 29 and the magnetization direction of the ferromagnetic layer 25 are the opposite of (antiparallel to) each other. Accordingly, where the magnetization direction of the ferromagnetic layer 29 is an upward direction, the magnetization direction of the ferromagnetic layer 25 is a downward direction, as shown in FIG. 1.

The anode of the diode 30 is electrically connected to a word line WL, and the cathode is electrically connected to the ferromagnetic layer 21. The ferromagnetic layer 29 is connected to a bit line BL. In other words, each memory cell 10 is architecture of a cross-point type that has one end connected to a word line WL and has the other end connected to a bit line BL. To reduce contact resistance, a low-resistance barrier metal, such as a metal layer made of Ti, TiN, W, or the like, may be inserted between the anode of the diode 30 and the word line WL, and between the cathode and the ferromagnetic layer 21.

Although the anode of each diode 30 is connected to the word line WL and the cathode of each diode 30 is connected to the ferromagnetic layer 21 in FIG. 1, each diode 30 may be connected to the side of the bit line BL. Specifically, the cathode of each diode 30 may be connected to the bit line BL, and the anode may be connected to the ferromagnetic layer 29.

Figure 2:
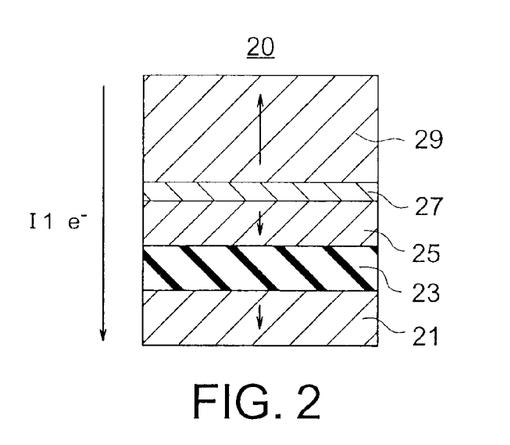
FIG. 2 is a cross-sectional view for explaining a method of writing a low-resistance state into the spin memory according to the first embodiment.
Figure 3:
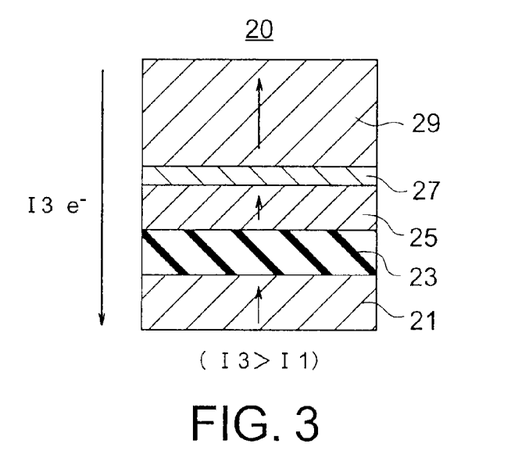
FIG. 3 is a cross-sectional view for explaining a method of writing a high-resistance state into the spin memory according to the first embodiment.
Figure 4:
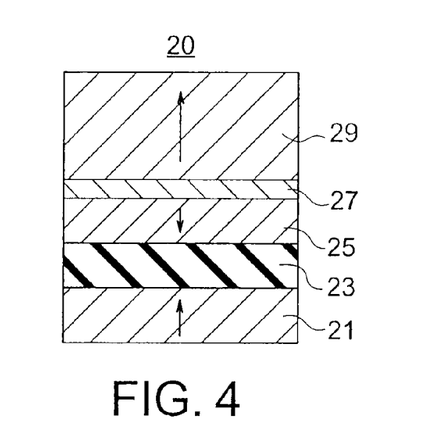
FIG. 4 is a cross-sectional view for explaining a method of writing a high-resistance state into the spin memory according to the first embodiment.

Referring now to FIGS. 2 through 4, a method of performing writing in a memory cell of the spin memory according to the first embodiment is described.

First, as shown in FIG. 2, when electrons having a current of a magnitude I1 (>0) are caused to flow from the ferromagnetic layer 29 to the ferromagnetic layer 21, the relative magnetization directions of the ferromagnetic layer 21 and the ferromagnetic layer 25 become substantially parallel to each other, based on the principles of spin-injection magnetization reversals (FIG. 2). In FIG. 2, the arrows indicate the directions of the flows of electrons, and the current I1 flows in the opposite direction from the arrows. At this point, the magnitude of the current I1 is such a magnitude as not to overcome the ferromagnetic magnetic-exchange coupling between the ferromagnetic layer 25 and the ferromagnetic layer 29. If a current I2 (>0) that is sufficiently smaller than (or does not cause a spin-injection magnetization reversal with) the magnitude of the current I1 is caused to flow in this situation, and the memory cell resistance is read, the relative magnetization directions of the ferromagnetic layer 25 and the ferromagnetic layer 21 become substantially parallel to each other. Accordingly, the ferromagnetic stacked film 20 or the memory cell 10 is put into a low-resistance state.

Next, a case where writing is performed with a current of a greater magnitude than I1 is described.

Since the ferromagnetic layer 29 and the ferromagnetic layer 25 are in contact with each other via the nonmagnetic layer 27 in the present situation, a spin-injection magnetization reversal between the ferromagnetic layer 29 and the ferromagnetic layer 25 can be caused by selecting appropriate materials for the ferromagnetic layers 29 and 25 and the nonmagnetic layer 27, and adjusting the thickness of the nonmagnetic layer 27 to an appropriate thickness. When a larger current than the current I1 flows between the ferromagnetic layer 29 and the ferromagnetic layer 21, or a current I3 of such a magnitude (>0) as to cause a spin-injection magnetization reversal in the ferromagnetic layer 25 flows, a spin-injection magnetization reversal is induced between the ferromagnetic layer 29 and the ferromagnetic layer 25, and the relative magnetization directions of the ferromagnetic layer 29 and the ferromagnetic layer 25 become substantially parallel to (the same as) each other. In FIG. 3, the arrows indicate the directions of the flows of electrons, and the current I3 flows in the opposite direction from the arrows. Since a spin-injection magnetization reversal is induced between the ferromagnetic layer 25 and the ferromagnetic layer 21 via the nonmagnetic layer 23, the relative magnetization directions of the ferromagnetic layer 25 and the ferromagnetic layer 21 become substantially antiparallel to each other (FIG. 3). In the above description, the current I3 is defined as a current of such a magnitude as to cause a spin-injection magnetization reversal in the ferromagnetic layer 25, but may be defined as a current of such a magnitude as to convert the antiferromagnetic magnetic-exchange coupling between the ferromagnetic layer 29 and the ferromagnetic layer 25 to ferromagnetic magnetic-exchange coupling.

Next, a case where the current is shut off in the situation illustrated in FIG. 3 is described. Since there is substantially antiparallel magnetic-exchange coupling between the ferromagnetic layer 29 and the ferromagnetic layer 25 via the nonmagnetic layer 27, the relative magnetization directions of the ferromagnetic layer 29 and the ferromagnetic layer 25 become substantially antiparallel to each other when the current stops flowing. In other words, when the current is shut off, the magnetization direction of the ferromagnetic layer 25 is reversed or becomes an opposite direction of the previous direction. Therefore, as shown in FIG. 4, the relative magnetization directions of the ferromagnetic layer 25 and the ferromagnetic layer 29 become substantially antiparallel to each other. At this point, there is not a current flowing in the ferromagnetic stacked film 20, and therefore, the magnetization direction of the ferromagnetic layer 21 does not change. If the current I2 that is sufficiently smaller than (or does not cause a spin-injection magnetization reversal with) the magnitude of the current I1 is caused to flow in this situation, and the memory cell resistance is read, the relative magnetization directions of the ferromagnetic layer 25 and the ferromagnetic layer 21 become substantially antiparallel to each other. Accordingly, the ferromagnetic stacked film 20 or the memory cell 10 is put into a high-resistance state.

As described above, the magnetized state of the ferromagnetic layer 21 in the memory cell 10 is rewritten with the use of only unidirectional currents. In other words, the memory cell 10 can be rewritten to be in a low-resistance state or a high-resistance state.

By appropriately selecting the materials of the ferromagnetic layer 21 and the ferromagnetic layer 25, the relative magnetization directions of the ferromagnetic layer 21 and the ferromagnetic layer 25 after the write current I1 or I3 is supplied can be set in a high-resistance state or a low-resistance state. For example, different kinds of magnetic metal materials are used for the ferromagnetic layer 21 and the ferromagnetic layer 25. In the combination that may be used here, the minority state density is high in one of the magnetic metal materials in terms of Fermi level, and the majority state density is high in the other.

To determine whether desired writing has been correctly performed, a verify write method may be used. Specifically, after writing is performed with the use of the write current I1 or I3, the magnetization direction of the memory cell on which the writing has been performed is read with the use of a lower current than the write currents I1 and I3. A check is then made to determine whether the desired writing has been performed. If the desired writing has not been performed, the desired writing may be performed again with the use of the above described write current. If the desired writing has not been performed, however, writing may be performed with a greater write pulse width, or writing may be performed several times, so as to increase the probability that the desired writing is properly performed. Alternatively, depending on the result of reading, writing may be again performed with a higher or lower write current. For example, if writing cannot be performed with the current I3, writing is again performed with a higher current than the current I3. If writing cannot be performed with the current I1, writing is again performed with a lower current than the current I1.

As described above, according to this embodiment, writing can be performed with unidirectional currents, and an increase of circuit area can be prevented by virtue of the cross-point type architecture.

In this embodiment, each memory cell 10 includes a diode 30. This diode 30 is used to allow only unidirectional currents or is used for rectification. Therefore, another element (a rectifying device) having a rectifying function, such as a Coulomb blockade device, may be used, instead of a diode.

The rectifying device such as the diode 30 may be omitted from each memory cell 10. In this case, there is a possibility that the current might enter from surrounding memory cells via bit lines and word lines. Therefore, it is necessary to increase the resistance change rate or the difference in resistance value between a low-resistance state and a high-resistance state.

Figure 5:
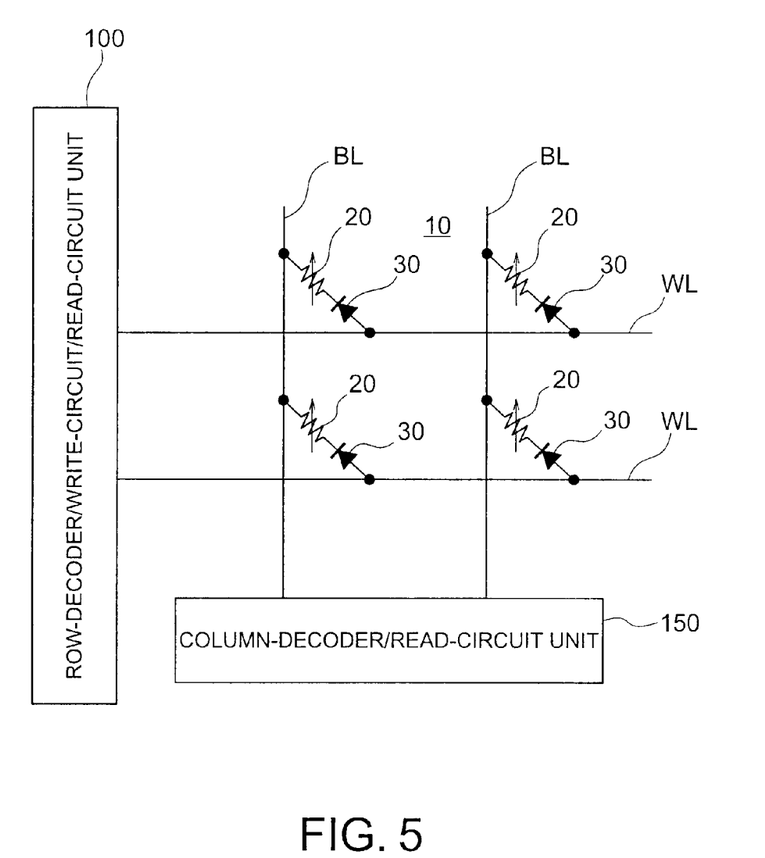
FIG. 5 is a circuit diagram showing a specific example circuit structure of the spin memory according to the first embodiment.

FIG. 5 shows a specific example circuit structure of the spin memory according to the first embodiment. This spin memory includes memory cells 10 arranged in a matrix fashion, word lines WL, bit lines BL intersecting with those word lines WL, a row-decoder/write-circuit/read-circuit unit 100, and a column-decoder/read-circuit unit 150. Each of the memory cells 10 is placed near an intersecting area between the word lines WL and the bit lines BL, and includes the diode 30 and the ferromagnetic stacked film 20 explained with reference to FIG. 1.

Figure 6:
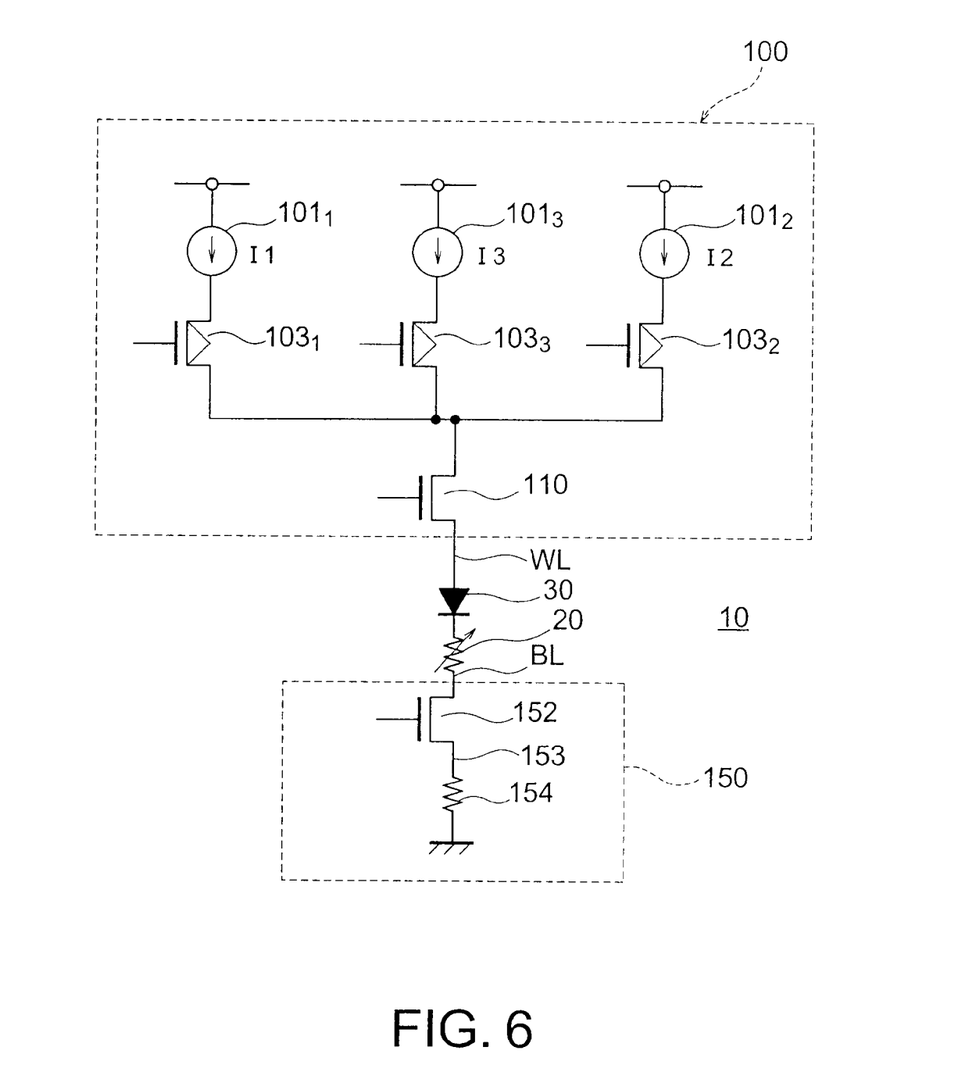
FIG. 6 is a circuit diagram showing a specific example write circuit and a specific example read circuit of the spin memory according to the first embodiment.

FIG. 6 shows a specific example of the row-decoder/write-circuit/read-circuit unit 100 and the column-decoder/read-circuit unit 150. The row-decoder/write-circuit/read-circuit unit 100 includes three current sources $101_1$, $101_2$, and $101_3$, three switches $103_1$, $103_2$, and $103_3$ formed with p-type MOS transistors, for example, and a select transistor 110 that is provided in a corresponding word line WL and is formed with an n-type MOS transistor, for example. The intensities of the currents generated from the current sources $101_1$, $101_2$, and $101_3$ are I1, I2, and I3, respectively. Here, the relationships among the current intensities are expressed as: I2<I1<I3. The current source $101_1$ and the switch $103_1$ are connected in series, and form a first series circuit. The current source $101_2$ and the switch $103_2$ are connected in series, and form a second series circuit. The current source $101_3$ and the switch $103_3$ are connected in series, and form a third series circuit. The first series circuit and the third series circuit form a write circuit, and the second series circuit forms a read circuit. Each of the first through third series circuits is connected to one end of the select transistor 110. The other end of the select transistor 110 is connected to the corresponding word line WL.

The column-decoder/read-circuit 150 includes a select transistor 152 that is provided in a corresponding bit line BL and is formed with an n-type MOS transistor, and a resistor 154. One end of the select transistor 152 is connected to the corresponding bit line BL, and the other end is grounded via the resistor 154.

The operations of the spin memory of the first embodiment having the above-described structure are now described.

First, writing to be performed to cause the ferromagnetic layer 21 of a memory cell 10 to have the magnetization direction shown in FIG. 2 with the use of a current having the intensity I1 is described. In this case, the row-decoder/write-circuit/read-circuit unit 100 sends a control signal to the gate of the select transistor 110, to turn on the select transistor 110. The column-decoder/read-circuit unit 150 sends a control signal to the gate of the select transistor 152, to turn on the select transistor 152. In this manner, the memory cell 10 on which the writing is to be performed is selected. The row-decoder/write-circuit/read-circuit unit 100 then sends a control signal to the gate of the switch $103_1$, to turn on the switch $103_1$. The write current I1 then flows from the current source $101_1$ into the selected memory cell 10 through the switch $103_1$, and the writing is performed to cause the selected memory cell 10 to have the magnetization directions shown in FIG. 2. This writing is ended when the row-decoder/write-circuit/read-circuit unit 100 sends a control signal to the gate of the switch $103_1$ and turns off the switch $103_1$.

Next, writing to be performed to cause the ferromagnetic layer 21 of a memory cell 10 to have the magnetization direction shown in FIG. 4 with the use of a current having the intensity I3 is described. The memory cell 10 on which the writing is to be performed is selected in the same manner as above. The row-decoder/write-circuit/read-circuit unit 100 then sends a control signal to the gate of the switch $103_3$, to turn on the switch $103_3$. The write current I3 then flows from the current source $101_3$ into the selected memory cell 10 through the switch $103_3$, and the writing is performed to cause the selected memory cell 10 to have the magnetization directions shown in FIG. 4. This writing is ended when the row-decoder/write-circuit/read-circuit unit 100 sends a control signal to the gate of the switch $103_3$ and turns off the switch $103_3$.

Next, a reading operation is described. The memory cell 10 on which reading is to be performed is selected in the same manner as above. The row-decoder/write-circuit/read-circuit unit 100 then sends a control signal to the gate of the switch $103_2$, to turn on the switch $103_2$. The write current I2 then flows from the current source $101_2$ into the selected memory cell 10 through the switch $103_2$. At this point, a voltage corresponding to the magnetization direction of the ferromagnetic layer 21 of the selected memory cell 10 appears at a connecting node 153 between the select transistor 152 and the resistor 154. By reading the voltage of the connecting node 153, a check can be made to determine whether the selected memory cell 10 is in a high-resistance state or a low-resistance state. The device for reading the voltage of the connecting node 153 and the device for determining whether the selected memory cell 10 is in a high-resistance state or a low-resistance state based on the voltage are not shown in FIG. 6, but are included in the column-decoder/read-circuit unit 150.

As described above, according to the first embodiment, writing can be performed with unidirectional currents, and an increase of the circuit area can be prevented.

Second Embodiment

Figure 7:
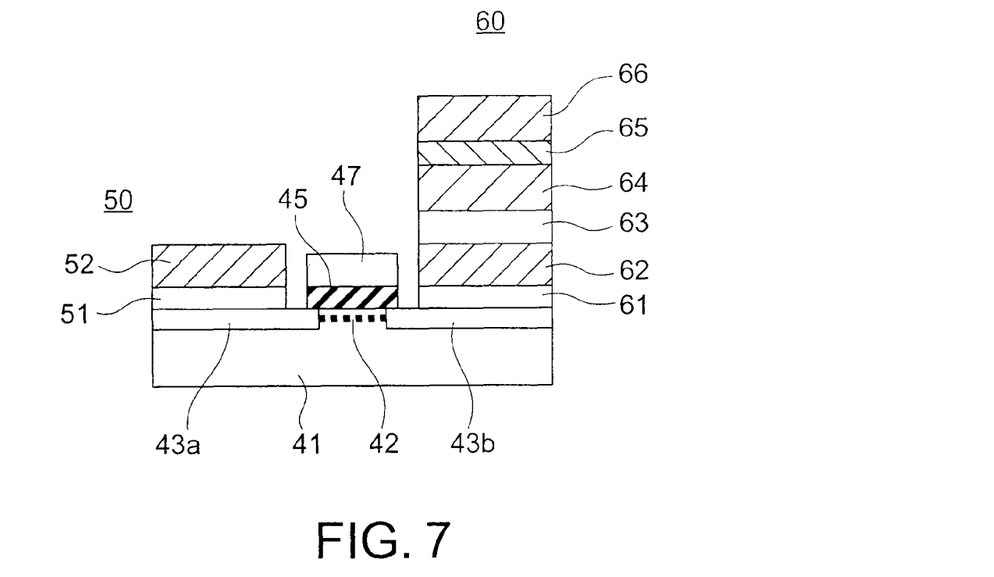
FIG. 7 is a cross-sectional view of a spin transistor according to a second embodiment.

FIG. 7 shows a spin transistor according to a second embodiment of the present invention. The spin transistor of the second embodiment is a spin transistor that is formed on a semiconductor layer 41. Here, a "semiconductor layer" means a semiconductor substrate, a well region formed in a semiconductor substrate, a SOI (Silicon On Insulator) layer in a SOI substrate, or the like. An impurity region 43a and an impurity region 43b that are doped with impurities at high density are provided at a distance from each other on the surface of the semiconductor layer 41. In this embodiment, the semiconductor layer 41 is an n-type semiconductor layer, the impurity region 43a and the impurity region 43b are a p-type impurity region 43a and a p-type impurity region 43b, and the spin transistor is a p-type spin transistor. In this case, the p-type impurity region 43a and the p-type impurity region 43b are to be a source region 43a and a drain region 43b. A channel region 42 is formed in a portion of the semiconductor layer 41 located between the source region 43a and the drain region 43b. A gate insulating film 45 is provided on the channel region 42, and a gate electrode 47 is provided on the gate insulating film 45. As the source region 43a and the drain region 43b, a semiconductor-metal compound (such as silicide) may be used, instead of a material doped with high-density impurities.

A source electrode 50 is provided on the source region 43a, and a drain electrode 60 is provided on the drain region 43b. The source electrode 50 has a first ferromagnetic stacked film in which a nonmagnetic layer 51 and a ferromagnetic layer 52 are stacked in this order. The drain electrode 60 has a second ferromagnetic stacked film in which a nonmagnetic layer 61, a ferromagnetic layer 62, a nonmagnetic layer 63, a ferromagnetic layer 64, a nonmagnetic layer 65, and a ferromagnetic layer 66 are stacked in this order. Accordingly, the ferromagnetic layer 52 and the ferromagnetic layer 62 are electrically connected to each other via the nonmagnetic layer 51, the source region 43a, the channel region 42, the drain region 43b, and the nonmagnetic layer 61.

The nonmagnetic layer 51 and the nonmagnetic layer 61 serve to prevent a reaction that might occur between the surface of the semiconductor layer 41 and the ferromagnetic layer 52, and a reaction that might occur between the surface of the semiconductor layer 41 and the ferromagnetic layer 62, respectively. Accordingly, the junction between the ferromagnetic layer 52 and the surface of the semiconductor layer 41, and the junction between the ferromagnetic layer 62 and the surface of the semiconductor layer 41 can be properly formed, and the transistor manufacture yield can be improved. Further, by virtue of the nonmagnetic layer 51 and the nonmagnetic layer 61, carriers can be injected into the channel region 42 at a high spin polarization rate. As a result, the conductance can be caused to vary more widely with the changes of the magnetization directions of the ferromagnetic layer 52 and the ferromagnetic layer 62. Depending on the performance required for the transistor, it is possible to form a nonmagnetic layer only between the surface of the semiconductor layer 41 and the ferromagnetic layer 62, or only between the surface of the semiconductor layer 41 and the ferromagnetic layer 52.

The ferromagnetic layer 52, the ferromagnetic layer 62, the ferromagnetic layer 64, and the ferromagnetic layer 66 each have an easy axis of magnetization that is substantially perpendicular to the film plane. More specifically, when there is not an external magnetic field, the magnetization direction of each of the ferromagnetic layers is substantially perpendicular to the film plane. The magnetization reversal magnetic fields of the ferromagnetic layers 62 and 64 are smaller than those of the ferromagnetic layers 52 and 66. The ferromagnetic layer 66 and the ferromagnetic layer 64 form antiferromagnetic magnetic-exchange coupling via the nonmagnetic layer 65, and the magnetization direction of the ferromagnetic layer 66 and the magnetization direction of the ferromagnetic layer 64 are the opposite from (antiparallel to) each other.

In the spin transistor of the second embodiment, the current obtained when a voltage is applied between the ferromagnetic layer 52 and the ferromagnetic layer 66 depends on the voltage applied to the gate electrode 47 and the relative magnetization directions of the ferromagnetic layer 52 and the ferromagnetic layer 62. Specifically, if the relative magnetization directions of the ferromagnetic layer 52 and the ferromagnetic layer 62 are substantially parallel to each other when a gate voltage is applied, a large current flows. If the relative magnetization directions of the ferromagnetic layer 52 and the ferromagnetic layer 62 are substantially antiparallel to each other when a gate voltage is applied, the amount of current to flow is small.

In the spin transistor of the second embodiment, the magnetization direction of the ferromagnetic layer 62 can be changed by causing currents with different intensities to flow from the first ferromagnetic stacked film 50 to the second ferromagnetic stacked film 60 through the channel region 42 (in the opposite direction from the flow of electrons), as described in the first embodiment. In other words, the magnetization direction of the ferromagnetic layer 62 can be changed only with unidirectional currents, as described in the first embodiment. In the p-type spin transistor of this embodiment, currents are caused to flow from the first ferromagnetic stacked film 50 serving as the source electrode to the second ferromagnetic stacked film 60 serving as the drain electrode through the channel region 42. In an n-type spin transistor, however, if the semiconductor layer 41 is a p-type semiconductor layer while the impurity regions 43a and 43b are n-type impurity regions, the impurity region 43a and the first ferromagnetic stacked film 50 turn into the drain region and the drain electrode, respectively, and the impurity region 43b and the second ferromagnetic stacked film 60 turn into the source region and the source electrode, respectively.

Unlike the spin transistor of this embodiment, the spin transistor disclosed in JP-A 2008-66596 (KOKAI), for example, requires bidirectional currents at the time of writing, and therefore, has problems such as large-size peripheral circuits and limited locations of use.

In the spin transistor of this embodiment, on the other hand, writing with unidirectional currents can be performed. Accordingly, the peripheral circuits can be simplified, and high compatibility with regular logic circuits can be secured.

Figure 8:
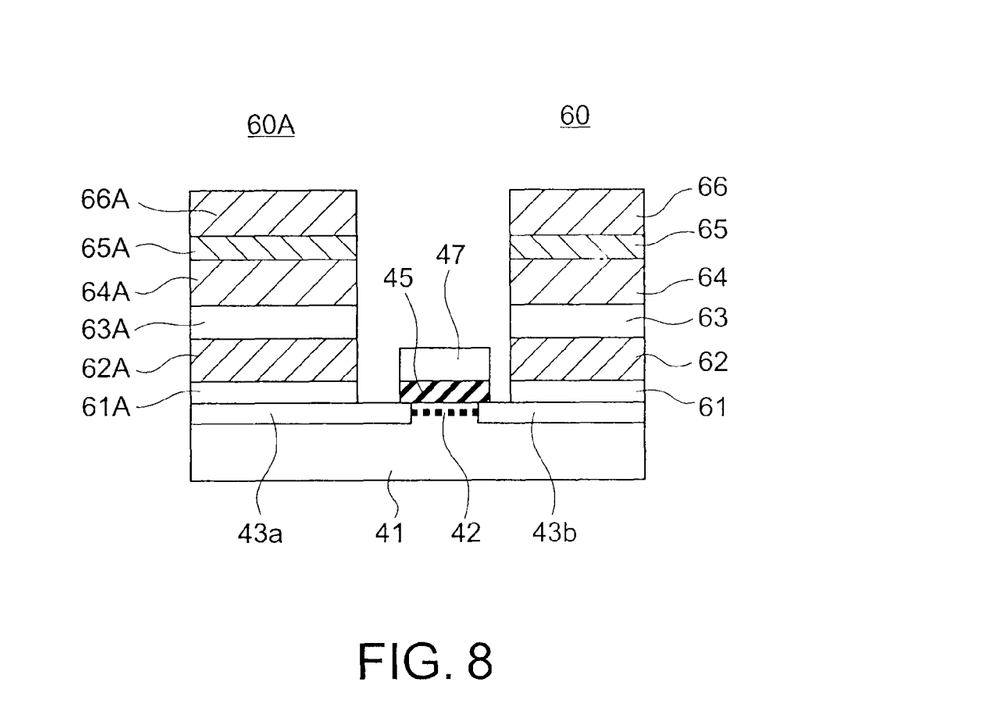
FIG. 8 is a cross-sectional view of a spin transistor according to a first modification of the second embodiment.

Instead of the first stacked film 50 provided as the source electrode 50, a stacked film 60A having the same structure as the second stacked film 60 provided as the drain electrode 60 may be provided as in a first modification illustrated in FIG. 8. More specifically, the stacked film 60A has a stacked structure in which a nonmagnetic layer 61A, a ferromagnetic layer 62A, a nonmagnetic layer 63A, a ferromagnetic layer 64A, a nonmagnetic layer 65A, and a ferromagnetic layer 66A are stacked in this order. In this case, the stacked film 60A as the source electrode is preferably made larger than the second stacked film 60 as the drain electrode, so that the magnetization of the ferromagnetic layer 62A is not reversed when a current is caused to flow from the stacked film 60A to the stacked film 60 through the channel region 42 (in the opposite direction from the flow of electrons).

Figure 9:
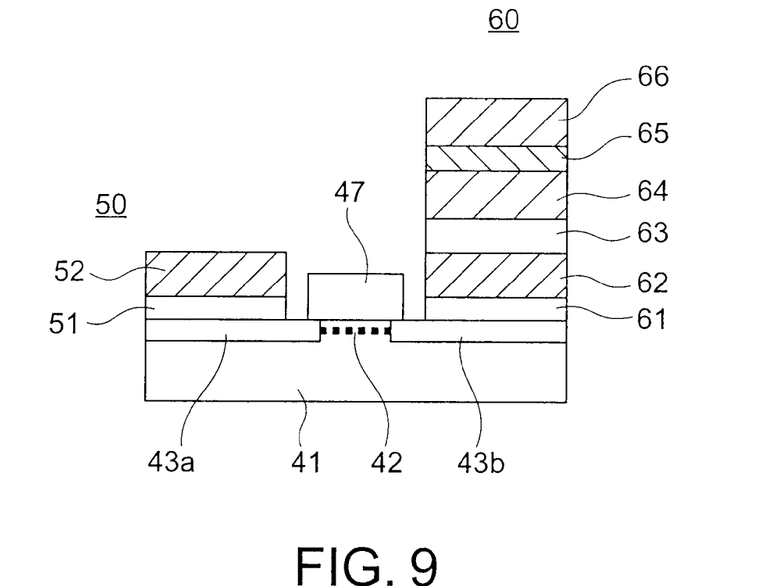
FIG. 9 is a cross-sectional view of a spin transistor according to a second modification of the second embodiment.
Figure 10:
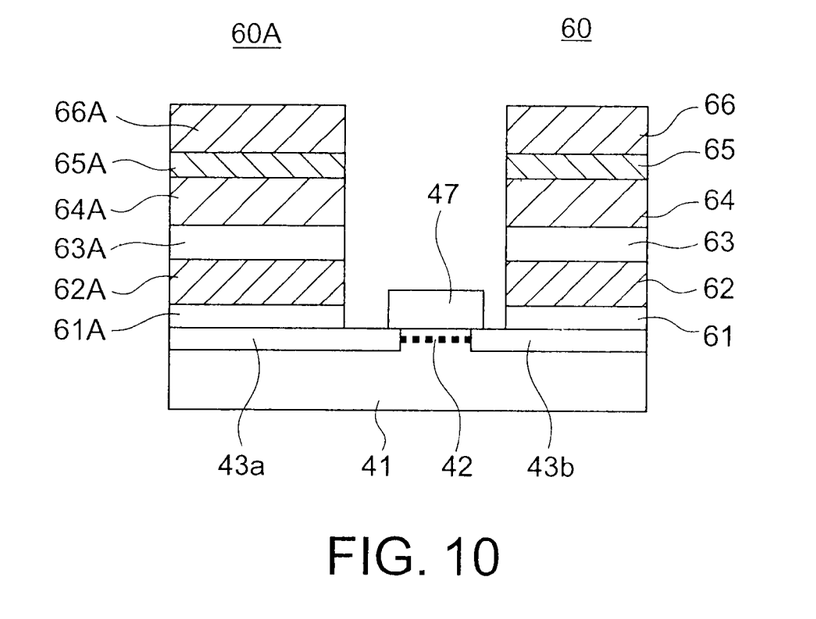
FIG. 10 is a cross-sectional view of a spin transistor according to a third modification of the second embodiment.

This embodiment and the first modification illustrated in FIG. 7 and FIG. 8 concern MOSFET structures each having the gate insulating film 45. However, it is possible to use a MESFET structure that does not have the gate insulating film 45 as in second and third modifications illustrated in FIG. 9 and FIG. 10.

Figure 11:
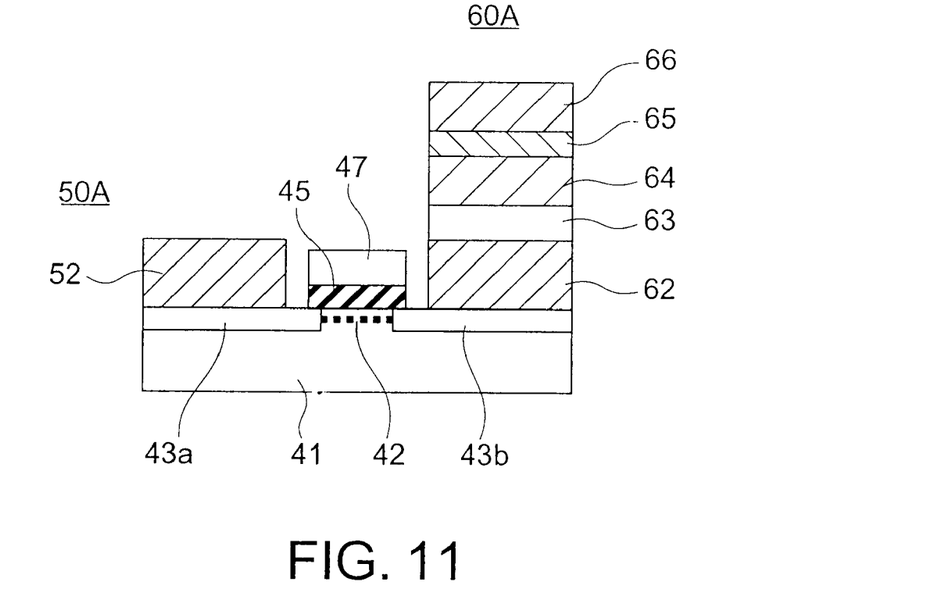
FIG. 11 is a cross-sectional view of a spin transistor according to a fourth modification of the second embodiment.
Figure 12:
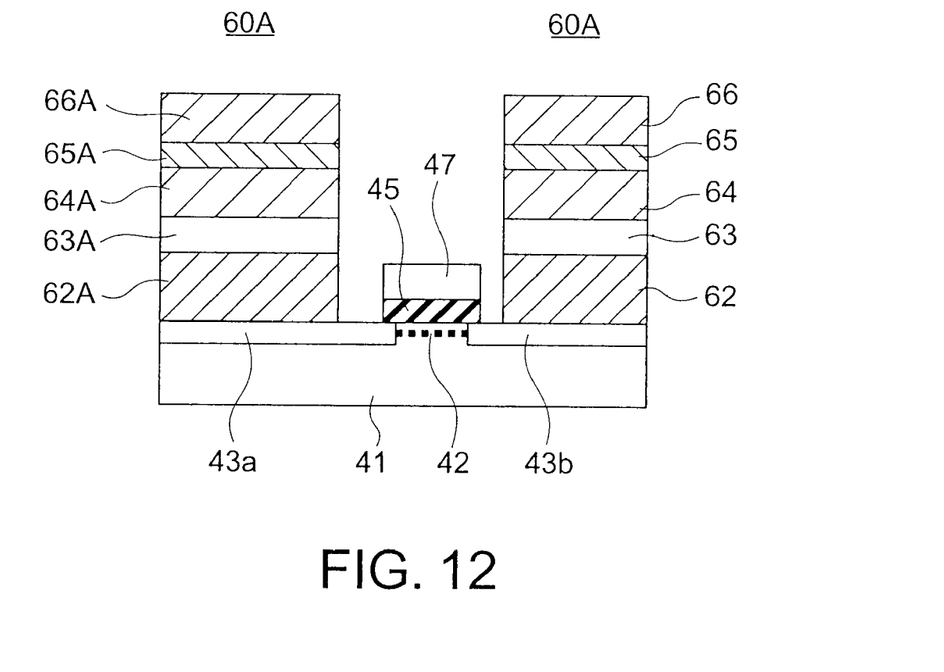
FIG. 12 is a cross-sectional view of a spin transistor according to a fifth modification of the second embodiment.

In this embodiment and the modifications illustrated in FIGS. 7 through 10, the source electrode 50 has the nonmagnetic layer provided between the semiconductor layer 41 and the ferromagnetic layer 52, and the drain electrode 60 has the nonmagnetic layer 61 provided between the semiconductor layer 41 and the ferromagnetic layer 62. However, a source electrode 50A from which the nonmagnetic layer 51 is eliminated, and a drain electrode 60A from which the magnetic layer 61 is eliminated may be used as in fourth and fifth modifications illustrated in FIG. 11 and FIG. 12.

As described above, according to the second embodiment and the modifications, writing can be performed with unidirectional currents, and there is no need to use a transistor for switching the directions of currents. Accordingly, the circuit area can be prevented from increasing.

In the second embodiment, a verify write method may be used to determine whether desired writing has been correctly performed, as in the first embodiment. If the desired writing has not been performed, writing may be performed with a greater write pulse width, or writing may be performed several times, so as to increase the probability that the desired writing is properly performed. Alternatively, depending on the result of reading, writing may be again performed with a higher or lower write current. For example, if writing cannot be performed with the current I3, writing is again performed with a higher current than the current I3. If writing cannot be performed with the current I1, writing is again performed with a lower current than the current I1.

Third Embodiment

Next, a spin transistor according to a third embodiment of the present invention is described. The spin transistor of the second embodiment illustrated in FIG. 7 is of a transverse type, and has a structure in which the source electrode and the source region having ferromagnetic layers are placed on a side of the channel region, and the drain region and the drain electrode are placed on the other side of the channel region. The spin transistor of the third embodiment is of a longitudinal type, and has a structure in which a source electrode, a channel region, and a drain electrode are stacked in this order on a semiconductor layer.

Figure 13:
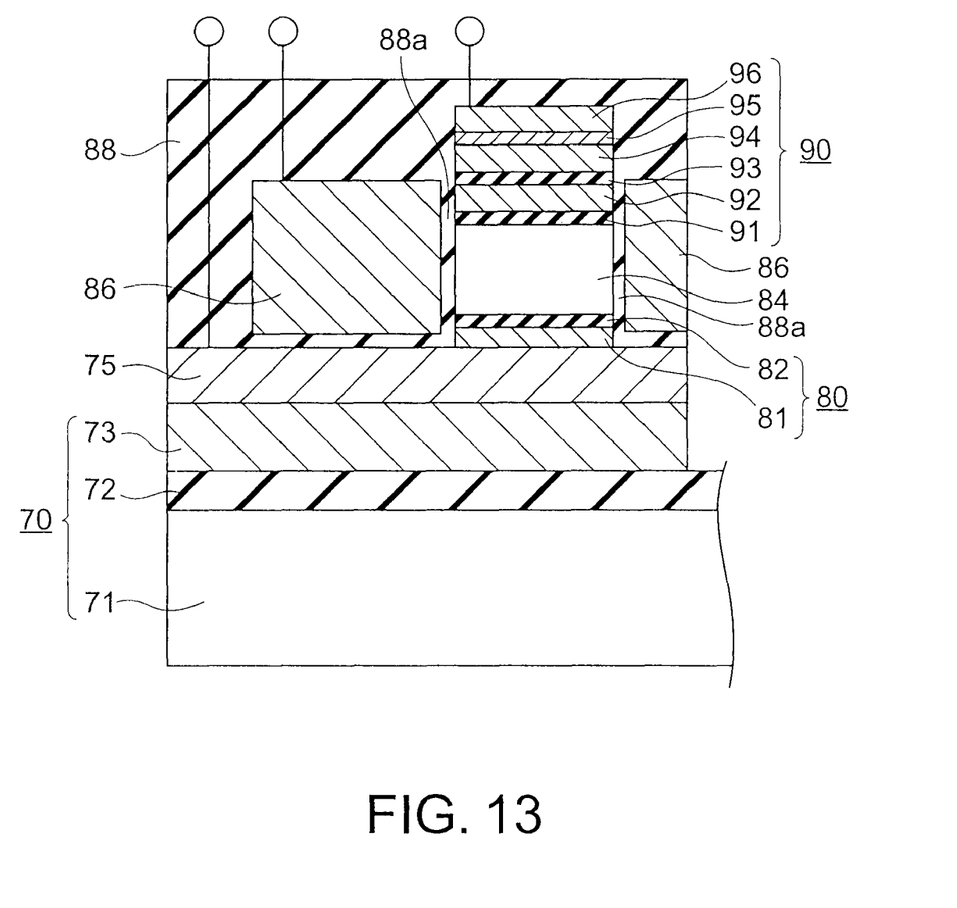
FIG. 13 is a cross-sectional view of a spin transistor according to a third embodiment.

FIG. 13 shows the spin transistor of the third embodiment. The spin transistor of this third embodiment is placed on a SOI substrate 70 that includes a supporting substrate 71 made of Si, a buried oxide film 72, and a SOI layer 73. The spin transistor of the third embodiment may be placed on a bulk substrate made of Si, instead of a SOI substrate. A conductive base layer 75 is provided on the SOI layer 73. A stacked structure in which a source electrode 80, a semiconductor crystalline layer 84 to be a channel region, and a drain electrode 90 are stacked in this order is provided on the base layer 75. Alternatively, a drain electrode, a channel region, and a source electrode may be stacked in this order on the base layer. A gate electrode 86 is formed to surround the semiconductor crystalline layer 84 serving as the channel region of the stacked structure, and has a gate insulating film 88a interposed between the semiconductor crystalline layer 84 and the gate electrode 86. In this embodiment, the gate electrode 86 is formed to surround the semiconductor crystalline layer 84. However, the gate insulating film 88a may be interposed between the gate electrode 86 and part of the side faces of the semiconductor crystalline layer 84. An insulating film 88 also exists between the gate electrode 86 and the base layer 75.

In this embodiment, the spin transistor is an n-type spin transistor, and the semiconductor crystalline layer 84 is a p-type semiconductor crystalline layer. In a p-type spin transistor in which the semiconductor crystalline layer 84 is an n-type semiconductor crystalline layer, the electrode 80 and the electrode 90 shown in FIG. 13 are the drain electrode and the source electrode, respectively.

The source electrode 80 includes a ferromagnetic layer 81 provided on the base layer 75, and a nonmagnetic layer 82 provided on the ferromagnetic layer 81. The drain electrode 90 has a stacked structure in which a nonmagnetic layer 91, a ferromagnetic layer 92, a nonmagnetic layer 93, a ferromagnetic layer 94, a nonmagnetic layer 95, and a ferromagnetic layer 96 are stacked in this order on the semiconductor crystalline layer 84. The ferromagnetic layer 81, the ferromagnetic layer 92, the ferromagnetic layer 94, and the ferromagnetic layer 96 each have an easy axis of magnetization that is substantially perpendicular to the film plane. Specifically, when there is not an external magnetic field, the magnetization direction of each of the ferromagnetic layers is substantially perpendicular to the film plane. The magnetization reversal magnetic fields of the ferromagnetic layers 92 and 94 are smaller than those of the ferromagnetic layers 81 and 96. The ferromagnetic layer 96 and the ferromagnetic layer 94 form antiferromagnetic magnetic-exchange coupling via the nonmagnetic layer 95, and the magnetization direction of the ferromagnetic layer 96 and the magnetization direction of the ferromagnetic layer 94 are the opposite from (antiparallel to) each other.

In the spin transistor of the third embodiment, the current obtained when a voltage is applied between the ferromagnetic layer 81 and the ferromagnetic layer 96, or between the base layer 75 and the ferromagnetic layer 96, depends on the voltage applied to the gate electrode 86 and the relative magnetization directions of the ferromagnetic layer 81 and the ferromagnetic layer 92. Specifically, if the relative magnetization directions of the ferromagnetic layer 81 and the ferromagnetic layer 92 are substantially parallel to each other when a gate voltage is applied, a large current flows. If the relative magnetization directions of the ferromagnetic layer 81 and the ferromagnetic layer 92 are substantially antiparallel to each other when a gate voltage is applied, the amount of current to flow is small.

In the spin transistor of the third embodiment, the magnetization direction of the ferromagnetic layer 92 can be changed only with unidirectional currents, as described in the second embodiment.

In the third embodiment, a source region and a drain region that are doped with high-density impurities of the opposite conductivity type from the semiconductor crystalline layer 84 should preferably be formed on the semiconductor crystalline layer side of the interface between the nonmagnetic layer 82 and the semiconductor crystalline layer 84, and on the semiconductor crystalline layer side of the interface between the nonmagnetic layer 91 and the semiconductor crystalline layer 84.

As the source electrode 80, a ferromagnetic stacked film having the same structure as the drain electrode 90 may be used. In this case, the layers in the ferromagnetic stacked film as the source electrode are stacked in the reverse order of the layers in the ferromagnetic stacked film as the drain electrode. Also, each layer in the ferromagnetic stacked film as the source electrode should preferably have a large film thickness or area to maintain a large volume so that the magnetization directions are not reversed when a current is caused to flow.

In the third embodiment, the SOI layer 73 of the lowermost layer may be a Si crystalline layer or a SiGe crystalline layer. The material of the semiconductor crystalline layer 84 may be Ge, Si, SiGe, GaAs, InGaAs, or the like. Here, it is essential to take into consideration the influence the crystal lattice of the SOI layer 73 as the lowermost layer has on the lattice spacing in the ferromagnetic layer 81 and the semiconductor crystalline layer 84. Particularly, the lattice and strain of the semiconductor crystalline layer 84 have a large influence on the mobility of the carriers in the semiconductor crystalline layer 84. The lattice spacing in the ferromagnetic layer 81 should preferably be matched to the lattice of the base layer 75. However, the crystal lattice of the semiconductor crystalline layer 84 is made slightly different from the crystal lattice of the base layer 75, and strain is actively caused. In this manner, the channel mobility can be improved. For example, SiGe crystals of 80% in Ge composition ratio are placed as the base layer 75, and the ferromagnetic layer 81 lattice-matched to those crystals is stacked. A Ge crystalline layer is then stacked as the semiconductor crystalline layer 84 that is to be the channel region. The Ge crystal lattice of the semiconductor crystalline layer 84 then becomes slightly larger than the lattice of the SiGe crystal layer as the base layer 75. Accordingly, the Ge crystal lattice of the semiconductor crystalline layer 84 is subjected to compression strain and shrinks in the horizontal direction to be matched to the base layer 75, and is subjected to tension stress and expands in the vertical direction. In other words, the Ge crystal lattice is subjected to tension stress in the current direction of the spin transistor, and accordingly, the electron mobility is effectively made higher. In this embodiment, the nonmagnetic layer 82 is provided between the ferromagnetic layer 81 and the semiconductor crystalline layer 84. If the nonmagnetic layer 82 is a crystalline layer, the nonmagnetic layer 82 is also affected by the base layer 75 via the ferromagnetic layer 81. Therefore, the Ge crystal lattice of the semiconductor crystalline layer 84 becomes slightly larger than the lattice of the SiGe crystalline layer serving as the base layer 75.

In a case where the spin transistor is a p-type spin transistor, SiGe crystals having a lower Ge composition ratio are preferably used as the material of the semiconductor crystalline layer 84. With this arrangement, the crystal lattice of the semiconductor crystalline layer 84 is made smaller than the lattice of the SiGe crystalline layer serving as the base layer 75, and is subject to compression stress in the current direction of the spin transistor.

As the gate insulating film 88a, a high-dielectric material having a metal such as Zr, Hf, or La solid-solved in $SiO_2$ such as Hf silicate or Zr silicate may be used, instead of a $SiO_2$ film used in a conventional MOSFET. As the gate electrode 86, Poly-Si or Poly-SiGe that is p-type or n-type doped is used. However, in a case where this is combined with a high-dielectric insulating film, it is possible to use a metal-based material such as TiN, TaN, TaC, a rare-earth metal, or a rare-earth transition metal alloy.

Figure 14:
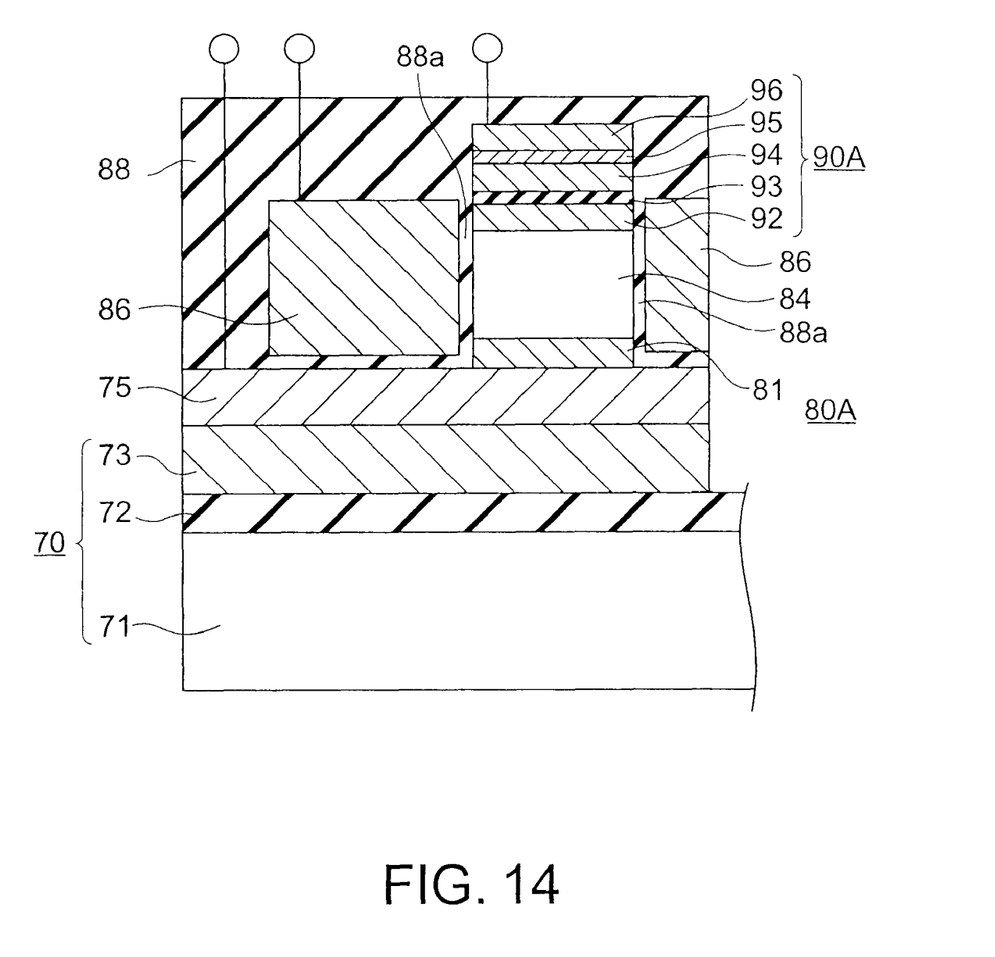
FIG. 14 is a cross-sectional view of a spin transistor according to a modification of the third embodiment.

In the third embodiment, the nonmagnetic layer 82 and the nonmagnetic layer 91 are provided at the interfaces between the semiconductor crystalline layer 84 to be the channel region and the source electrode 80 and the drain electrode 90, respectively. However, as in a modification illustrated in FIG. 14, a source electrode 80A and a drain electrode 90A from which the nonmagnetic layer 82 and the nonmagnetic layer 91 are eliminated may be used.

As described above, according to the third embodiment and the modification, writing can be performed with unidirectional currents, and there is no need to use a transistor for switching the directions of currents, as in the second embodiment. Accordingly, the circuit area can be prevented from increasing.

In the third embodiment, a verify write method may be used to determine whether desired writing has been correctly performed, as in the first embodiment. If the desired writing has not been performed, writing may be performed with a greater write pulse width, or writing may be performed several times, so as to increase the probability that the desired writing is properly performed. Alternatively, depending on the result of reading, writing may be again performed with a higher or lower write current. For example, if writing cannot be performed with the current I3, writing is again performed with a higher current than the current I3. If writing cannot be performed with the current I1, writing is again performed with a lower current than the current I1.

In the above described first through third embodiments and their modifications, the following materials may be used.

First, as for the semiconductor layer, an n- or p-type silicon substrate can be used. Further, it is possible to use a Ge substrate, a $Si_xGe_{1-x}$ (0<x<1) substrate, a group III-V or group II-VI compound semiconductor layer, a magnetic semiconductor layer, or the like. It is also possible to use a semiconductor formed on an insulator (such as SOI, GOI, SiGe On I, III-V On I, or II-IV On I).

Each of the ferromagnetic layers should preferably have unidirectional anisotropy. The film thickness of each of the ferromagnetic layers is preferably in the range of 0.1 to 100 nm. Furthermore, each of the ferromagnetic layers needs to have such a thickness as not to be superparamagnetic, and preferably has a thickness of 0.4 nm or greater. As for the material of each of the ferromagnetic layers, it is possible to use a Heusler alloy such as $Co_2FeAl_{1-x}Si_x$ (0<x≦1) or $Co_2Mn_{1-x}Fe_xSi$ (0<x≦1).

As for each of the ferromagnetic layer, it is also possible to use Co, Fe, Ni, or an alloy of those materials, an alloy containing at least one element selected from the group consisting of Co, Fe, Ni, Ru, Rh, Pd, La, Ce, Pr, Nd, Pm, Sm, Eu, Gd, Tb, Dy, Ho, Er, Tm, Yb, and Lu, an alloy such as Co—Pt, Co—Fe—Pt, Fe—Pt, Co—Fe—Cr—Pt, Co—Cr—Pt, Co—Pd, NiMnSb, $Co_2MnGe$, $Co_2MnAl$, $Co_2MnSi$, or CoCr-FeAl, or a magnetic material formed from the group of magnetic semiconductors such as GeMn, SiCNi, SiCMn, SiCFe, ZnMnTe, ZnCrTe, BeMnTe, ZnVO, ZnMnO, ZnCoO, GaMnAs, InMnAs, InMnAb, GaMnP, GaMnN, GaCrN, AlCrN, BiFeTe, SbVTe, PbSnMnTe, GeMnTe, CdMnGeP, ZnSiNMn, ZnGeSiNMn, BeTiFeO, CdMnTe, ZnMnS, TiCoO, SiMn, and SiGeMn. Further, a nonmagnetic element such as Ag (silver), Cu (copper), Au (gold), Al (aluminum), Ru (ruthenium), Os (osmium), Re (rhenium), Ta (tantalum), B (boron), C (carbon), O (oxygen), N (nitrogen), Pd (palladium), Pt (platinum), Zr (zirconium), Ir (iridium), W (tungsten), Mo (molybdenum), or Nb (niobium) is added to the above mentioned magnetic material, to adjust the magnetic properties and adjust various kinds of properties such as crystalline properties, mechanical properties, and chemical properties.

As for the nonmagnetic layers 23, 51, 61, 82, 91, and 93, it is preferable to use an oxide or nitride of Si, Ge, Al, Ga, Mg, Ti, or the like, or SrTiO, NdGaO, or the like.

As for the nonmagnetic layers 27, 65, and 95, it is preferable to use a metal layer containing at least one element selected from the group consisting of Cu, Ru, Cr, Au, Ag, Hf, Zr, Rh, Pt, Ir, Al, La, and Mg, or an alloy or oxide layer of those materials. It is also possible to use an oxide or nitride of Si, Ge, Al, Ga, Mg, Ti, or the like, SrTiO, NdGaO, $Si_xGe_{1-x}$ (0<x<1), a group III-V or II-VI compound semiconductor, or a magnetic semiconductor. Further, it is possible to use an oxide or nitride of Si, Ge, Al, Ga, Mg, Ti, or the like, or SrTiO, NdGaO, or the like.

EXAMPLES

The following is a detailed description of examples of the present invention, with reference to the accompanying drawings.

Example 1

As Example 1 of the present invention, a method of manufacturing a spin memory having the structure illustrated in FIG. 1 is described. The procedures for manufacturing this spin memory are as follows.

First, a base electrode (not shown) formed with a stacked film of Ta (50 nm) and Ru (10 nm) is formed on a silicon substrate having diodes. The numerical values in parentheses indicate film thicknesses (the same applies to the later descriptions). A magnetic layer 21 made of TbFeCo (3 nm), a nonmagnetic layer 23 made of MgO (0.8 nm), a ferromagnetic layer 25 made of GdFeCo (3 nm), a nonmagnetic layer 27 made of Cu (0.9 nm), a ferromagnetic layer 29 made of GdFeCo (6 nm), and a contact layer (not shown) made of Ta (150 nm) are sequentially formed on the base electrode by a sputtering technique, to form a ferromagnetic stacked film 20.

A mask formed with a resist is formed on the ferromagnetic stacked film 20 with the use of an ArF stepper device. With the use of this mask, patterning is performed on the ferromagnetic stacked film 20 by Ar ion milling, to divide the ferromagnetic stacked film 20 into memory cells. After the mask is removed, a 35-nm thick protection film made of silicon oxide is formed to protect the side faces of the ferromagnetic stacked film. A mask that is made of Ta/Ru and is to be used for patterning the base electrode is formed. With the use of this mask, etching is performed on the base electrode by Ar ion milling, to divide the base electrode into the respective memory cells. After an interlayer insulating film (not shown) made of silicon oxide is formed, etchback is performed to expose the contact layer. Cleaning is then performed on the upper face of the contact layer, and a metal stacked film formed with Ti (15 nm), Al (300 nm), and Ti (15 nm) is formed by a sputtering technique. Etching is then performed on the metal stacked film by RIE (Reactive Ion Etching), to form an upper electrode.

A spin-injection magnetization reversal was tried on the spin memory manufactured through the above-described process. The specific procedures are as follows.

First, a write current J1 was caused to flow at a current density of $8\times10^5$ A/cm$^2$ with respect to the junction area. A read current J2 was then caused to flow at a current density of $5\times10^4$ A/cm$^2$, and the device resistance was measured. As a result, the device resistance was 11 Ωμm$^2$, converted into RA (Resistance-Area product). After a write current J3 was caused to flow at a current density of $5\times10^6$ A/cm$^2$ with respect to the junction area, the read current J2 was then caused to flow at a current density of $5\times10^4$ A/cm$^2$, and the device resistance was measured. As a result, the device resistance was 32 Ωμm$^2$, converted into RA. The currents J1, J2, and J3 flowed in the same direction.

As is apparent from the above results, writing of a low-resistance state and a high-resistance state can be performed on the spin memory of Example 1 with the unidirectional currents.

Example 2

As this example, a method of manufacturing a spin transistor having the structure illustrated in FIG. 8 is described. The procedures for manufacturing this spin transistor are as follows.

First, a device isolating region (not shown), a gate insulating film 45, and a gate electrode 47 are formed by a conventional CMOS process. Ion implantation and activation annealing are then performed to form a source region 43a and a drain region 43b. After that, sidewalls (not shown) made of an insulator are formed on the side faces of the gate electrode 47. A nonmagnetic layer (a tunnel barrier layer) made of MgO (0.6 nm), a magnetic layer made of TbFeCo (3 nm), a nonmagnetic layer (a tunnel barrier layer) made of MgO (0.8 nm), a magnetic layer formed with GdFeCo (3 nm), Cu (0.9 nm), and GdFeCo (6 nm), and a contact layer (not shown) made of Ta (150 nm) are sequentially formed by a sputtering technique, to form a ferromagnetic stacked film.

A mask formed with a resist is formed on the ferromagnetic stacked film with the use of an ArF stepper device. With the use of this mask, patterning is performed on the ferromagnetic stacked film by Ar ion milling, and only ferromagnetic stacked films 60A and 60 are left on the source region and the drain region. After an interlayer insulating film (not shown) made of silicon oxide is formed, etchback is performed to expose the upper face of the contact layer. Cleaning is then performed on the upper face of the contact layer, and a metal stacked film formed with Ti (15 nm), Al (300 nm), and Ti (15 nm) is formed by a sputtering technique. Etching is then performed on the metal stacked film by RIE, to form an upper electrode (not shown) on each of the source electrode 60A and the drain electrode 60.

To simplify the manufacture of devices in this example, the ferromagnetic stacked films 60A and 60 having tunnel junctions are formed as the source electrode and the drain electrode or a part of the source electrode and a part of the drain electrode on the source region and the drain region of the transistor, respectively.

A spin-injection magnetization reversal was tried on the spin transistor manufactured through the above-described process. The specific procedures are as follows.

First, a voltage is applied to the gate electrode, to energize the channel. A write current is then caused to flow between the ferromagnetic layer 62 of the ferromagnetic stacked film 60 and the ferromagnetic layer 62A of the ferromagnetic stacked film 60A. At this point, the amount of current J1 caused to flow was $8\times10^5$ A/cm$^2$, converted into the current density with respect to the junction area of the ferromagnetic stacked film 60 (hereinafter all current densities will be defined with respect to the junction area of the ferromagnetic stacked film 60). A read current J2 was then applied at a current density of $5\times10^4$ A/cm$^2$, and the resistance between the ferromagnetic layer 62A of the ferromagnetic stacked film 60A and the ferromagnetic layer 62 of the ferromagnetic stacked film 60 was measured, which was 101Ω. After a write current J3 was caused to flow at a current density of $5 \times 10^6$ A/cm$^2$, the read current J2 was caused to flow at a current density of $5 \times 10^4$ A/cm$^2$, and the device resistance was measured. As a result, the device resistance was 152Ω. The currents J1, J2, and J3 flowed in the same direction.

As is apparent from the above results, writing of a low-resistance state and a high-resistance state can be performed on the spin transistor of this example with the unidirectional currents.

The present invention is not limited by the above described embodiments and examples. For instance, the type of the channel is not necessary an enhanced type, but may be a depletion type. To form the channel, not only ion implantation but also a hetero-interface growing process using modulation doping may be performed.

Also, an integrated circuit may be formed with spin memories or spin transistors of any of the above embodiments and examples. A memory may be formed with memory cells that include spin memories or spin transistors of any of the above embodiments and examples, field-effect transistors, and other memory devices. For example, a DRAM (Dynamic Random Access Memory) can be formed with those spin memories or spin transistors in combination with dielectric capacitors, a FRAM (Ferroelectric Random Access Memory) can be formed in combination with ferroelectric capacitors, and a MRAM (Magnetic Random Access Memory) can be formed in combination with magnetoresistive devices. Further, the spin transistors of the above embodiments and examples can be used as transistors of an EEPROM (a programmable read-only memory that electrically performs data writing and erasing).

Also, it is possible to provide a memory that uses the variable magnetization electrode of a spin transistor of the above embodiments and examples as a storage unit, stores data as the magnetization direction of the electrode, and reads out the data by using the magnetoresistive effect caused between the fixed magnetization electrode and the variable magnetization electrode.

The present invention is not limited to the above embodiments and examples, but modifications may be made to the components in the implementation phase, without departing from the scope of the invention. Also, the components disclosed in the embodiments and examples may be appropriately combined to form various inventions. For example, some components may be eliminated from the components disclosed in the embodiments and examples. Further, some components from one embodiment or example may be combined with some components from another embodiment or example, as needed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A spin memory comprising
a memory cell including a ferromagnetic stacked film that has a stacked structure in which a first ferromagnetic layer, a first nonmagnetic layer, a second ferromagnetic layer, a second nonmagnetic layer, and a third ferromagnetic layer are stacked in this order or reverse order, the third ferromagnetic layer and the second ferromagnetic layer being antiferromagnetically exchange-coupled via the second nonmagnetic layer,
the ferromagnetic stacked film including a current path in which a first and second write currents flow from the first ferromagnetic layer to the third ferromagnetic layer to write a first and second magnetization states into the first ferromagnetic layer respectively, and the second write current being higher than the first write current.

2. The memory according to claim 1, wherein the memory cell further includes a rectifying device that causes a current to flow in the ferromagnetic stacked film only in a direction in which the first and second write currents flow.

3. The memory according to claim 1, wherein the first, second, and third ferromagnetic layers each have magnetization that is substantially perpendicular to a film plane.

4. The memory according to claim 1, wherein the first and second ferromagnetic layers each have a smaller magnetization reversal magnetic field than a magnetization reversal magnetic field of the third ferromagnetic layer.

5. The memory according to claim 1, wherein
the first write current makes a magnetization direction of the first ferromagnetic layer substantially antiparallel to a magnetization direction of the third ferromagnetic layer, and the second write current reverses a magnetization direction of the second ferromagnetic layer and makes the magnetization direction of the first ferromagnetic layer substantially parallel to the magnetization direction of the third ferromagnetic layer.

6. The memory according to claim 5, further comprising:
a write circuit that supplies the first and second write currents to the memory cell.

7. A spin transistor comprising:
a source region and a drain region that are placed at a distance from each other on a semiconductor layer;
a gate electrode that is provided on a portion of the semiconductor layer, the portion being to serve as a channel region between the source region and the drain region;
a first electrode that is placed on one of the source region and the drain region, and has a first stacked structure in which a first ferromagnetic layer, a first nonmagnetic layer, a second ferromagnetic layer, a second nonmagnetic layer, and a third ferromagnetic layer are stacked in this order, the third ferromagnetic layer and the second ferromagnetic layer being antiferromagnetically exchange-coupled via the second nonmagnetic layer, the first stacked structure including a current path in which a first and second write currents flow from the first ferromagnetic layer to the third ferromagnetic layer to write a first and second magnetization states into the first ferromagnetic layer respectively, the second write current being higher than the first write current; and
a second electrode that is placed on the other one of the source region and the drain region, and includes a fourth ferromagnetic layer.

8. The transistor according to claim 7, wherein the first, second, third, and fourth ferromagnetic layers each have an easy axis of magnetization that is substantially perpendicular to a film plane.

9. The transistor according to claim 7, further comprising a gate insulating film that is placed between the channel region and the gate electrode.

10. The transistor according to claim 7, further comprising:
a first tunnel barrier layer that is placed between the first ferromagnetic layer and the one of the source region and the drain region; and a second tunnel barrier layer that is placed between the fourth ferromagnetic layer and the other one of the source region and the drain region.

11. The transistor according to claim 7, wherein
the second electrode includes a second stacked structure that includes a third nonmagnetic layer placed on the fourth ferromagnetic layer, a fifth ferromagnetic layer placed on the third nonmagnetic layer, a fourth nonmagnetic layer placed on the fifth ferromagnetic layer, and a sixth ferromagnetic layer placed on the fourth nonmagnetic layer, the fifth ferromagnetic layer and the sixth ferromagnetic layer being antiferromagnetically exchange-coupled via the fourth nonmagnetic layer, and
a film plane of the fourth ferromagnetic layer has a larger area than a film plane of the first ferromagnetic layer.

12. A spin transistor comprising:
a first electrode that is placed on a semiconductor substrate, and includes a first ferromagnetic layer having an easy axis of magnetization that is substantially perpendicular to a film plane;
a semiconductor layer that is placed on the first ferromagnetic layer, and is to serve as a channel;
a second electrode that has a stacked structure that is placed on the semiconductor layer, and includes a second ferromagnetic layer having an easy axis of magnetization substantially perpendicular to a film plane, a first nonmagnetic layer placed on the second ferromagnetic layer, a third ferromagnetic layer that is placed on the first nonmagnetic layer and has an easy axis of magnetization substantially perpendicular to a film plane, a second nonmagnetic layer placed on the third ferromagnetic layer, and a fourth ferromagnetic layer that is placed on the second nonmagnetic layer and has an easy axis of magnetization substantially perpendicular to a film plane, the fourth ferromagnetic layer being antiferromagnetically exchange-coupled to the third ferromagnetic layer via the second nonmagnetic layer, the stacked structure including a current path in which a first and second write currents flow from the second ferromagnetic layer to the fourth ferromagnetic layer to write a first and second magnetization states into the second ferromagnetic layer respectively, the second write current being higher than the first write current;
a gate insulating film that is placed on a side face of the semiconductor layer; and
a gate electrode that is placed on the opposite side of the gate insulating film from the semiconductor layer.

13. The transistor according to claim 12, further comprising:
a first tunnel barrier layer that is placed between the first ferromagnetic layer and the semiconductor layer; and
a second tunnel barrier layer that is placed between the semiconductor layer and the second ferromagnetic layer.

* * * * *